(12) United States Patent
Nakano et al.

(10) Patent No.: US 11,984,409 B2
(45) Date of Patent: May 14, 2024

(54) PHOTOELECTRIC CONVERSION PANEL

(71) Applicant: SHARP KABUSHIKI KAISHA, Sakai (JP)

(72) Inventors: Fumiki Nakano, Sakai (JP); Makoto Nakazawa, Sakai (JP); Hiroyuki Moriwaki, Sakai (JP); Rikiya Takita, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 393 days.

(21) Appl. No.: 17/394,794

(22) Filed: Aug. 5, 2021

(65) Prior Publication Data

US 2022/0045019 A1 Feb. 10, 2022

Related U.S. Application Data

(60) Provisional application No. 63/063,620, filed on Aug. 10, 2020.

(51) Int. Cl.
*H01L 23/00* (2006.01)
*H01L 27/146* (2006.01)

(52) U.S. Cl.
CPC ...... *H01L 23/564* (2013.01); *H01L 27/14643* (2013.01)

(58) Field of Classification Search
CPC ............. H01L 23/564; H01L 27/14643; H01L 27/14609; H01L 27/14612; H01L 27/14676; H01L 27/14692; H01L 29/786
See application file for complete search history.

(56) References Cited

U.S. PATENT DOCUMENTS

| | | | |
|---|---|---|---|
| 2015/0041781 A1 | 2/2015 | Hatano et al. | |
| 2017/0271423 A1* | 9/2017 | Murai | H10K 59/131 |
| 2018/0124933 A1* | 5/2018 | Park | H10K 59/00 |
| 2018/0301495 A1* | 10/2018 | Ito | H01L 27/14612 |
| 2019/0237692 A1* | 8/2019 | Nakazawa | H10K 30/88 |
| 2020/0161360 A1* | 5/2020 | Misaki | H01L 27/14616 |

FOREIGN PATENT DOCUMENTS

JP 2013-123000 A 6/2013

* cited by examiner

*Primary Examiner* — Kyoung Lee
*Assistant Examiner* — Sophia W Kao
(74) *Attorney, Agent, or Firm* — ScienBiziP, P.C.

(57) ABSTRACT

A photoelectric conversion panel includes a thin-film transistor provided in a first region, a photoelectric conversion element provided in the first region, a first organic film having a first groove portion provided in a second region, a second organic film having a second groove portion provided in the second region and in a position different from that of the first groove portion, a first inorganic film formed so as to cover the first organic film and cover an inner surface of the first groove portion, and a second inorganic film formed so as to cover the second organic film and cover an inner surface of the second groove portion.

5 Claims, 7 Drawing Sheets

PHOTOELECTRIC CONVERSION PANEL

BACKGROUND

1. Field

The present disclosure relates to a photoelectric conversion panel.

2. Description of the Related Art

Conventionally, there has been known a photoelectric conversion panel having a photoelectric conversion element. Such a photoelectric conversion panel is disclosed, for example, in Japanese Unexamined Patent Application Publication No. 2013-123000.

Japanese Unexamined Patent Application Publication No. 2013-123000 discloses a solid-state imaging device including a chip provided with a functional area that performs a photoelectric conversion and a peripheral area that is an area around the functional area in which a plurality of bonding pads are provided. Each of the plurality of bonding pads is provided with an opening. Further, this solid-state imaging device is provided with a plurality of insulating films stacked on top of each other. Moreover, in a plan view, a groove portion is formed in the same position as the plurality of insulating films. Moreover, a passivation film, formed inside the groove portion, that covers the insulating films is constituted as a guard ring. The guard ring is provided in an area that surrounds the functional area and that does not include the openings. The guard ring is constituted by a material film that does not allow passage of moisture or oxygen. As a result, the guard ring has a function of inhibiting moisture and gas having entered through an end face of the chip or side surfaces of the openings from entering the functional area in a transverse direction via the insulating films.

In the chip (photoelectric conversion panel) described in Japanese Unexamined Patent Application Publication No. 2013-123000, entry of moisture and gas into the functional area is inhibited by forming the groove portion in the same position as the plurality of insulating films in a plan view and forming the passivation film, which functions as the guard ring, inside this groove portion. For this reason, the groove portion needs to be formed across the plurality of insulating layers, so that the groove portion ends up having a comparatively great depth. Moreover, when the photoelectric conversion panel is manufactured (i.e. when a metal film constituting an electrode or a wire is formed), a portion of metal that needs to be removed may remain in the groove portion due to the comparatively great depth of the groove portion. In this case, there may a possibility that an electric current may leak through the metal remaining in the groove portion. To address this problem, there has been a demand for a photoelectric conversion panel capable of, when the photoelectric conversion panel is manufactured, inhibiting metal from remaining in a groove portion that serves to inhibit moisture and gas from entering a functional area (i.e. a first region in which a thin-film transistor and a photoelectric conversion element are provided).

It is desirable to provide a photoelectric conversion panel capable of, when the photoelectric conversion panel is manufactured, inhibiting metal from remaining in a groove portion that serves to inhibit moisture and gas from entering a first region in which a thin-film transistor and a photoelectric conversion element are provided.

SUMMARY

According to an aspect of the disclosure, there is provided a photoelectric conversion panel including a thin-film transistor provided in a first region, a photoelectric conversion element provided in the first region and formed at a higher layer than the thin-film transistor, a first organic film covering the thin-film transistor and having a first groove portion provided in a second region differing from the first region, a second organic film covering the photoelectric conversion element and having a second groove portion provided in the second region and in a position different from that of the first groove portion in a plan view, a first inorganic film formed so as to cover the first organic film and cover an inner surface of the first groove portion, and a second inorganic film formed so as to cover the second organic film and cover an inner surface of the second groove portion.

DESCRIPTION OF THE EMBODIMENTS

The following describes embodiments of the present disclosure with reference to the drawings. The present disclosure is not limited to the following embodiments but may be subject to design change as appropriate within a scope that satisfies the configuration of the present disclosure. Further, in the following description, identical components or components having similar functions are denoted by identical signs that are adhered to throughout the drawings, and a repeated description of such components is omitted. Further, configurations described in the embodiments and modifications may be combined or changed as appropriate without departing from the scope of the present disclosure. Further, for ease of comprehension of the description, the drawings to be referred to below show configurations in a symbolic and simplified manner or omit some constituent members. Further, the dimensional ratio between constituent members shown in each drawing does not necessarily indicate an actual dimensional ratio.

First Embodiment

Figure 1:
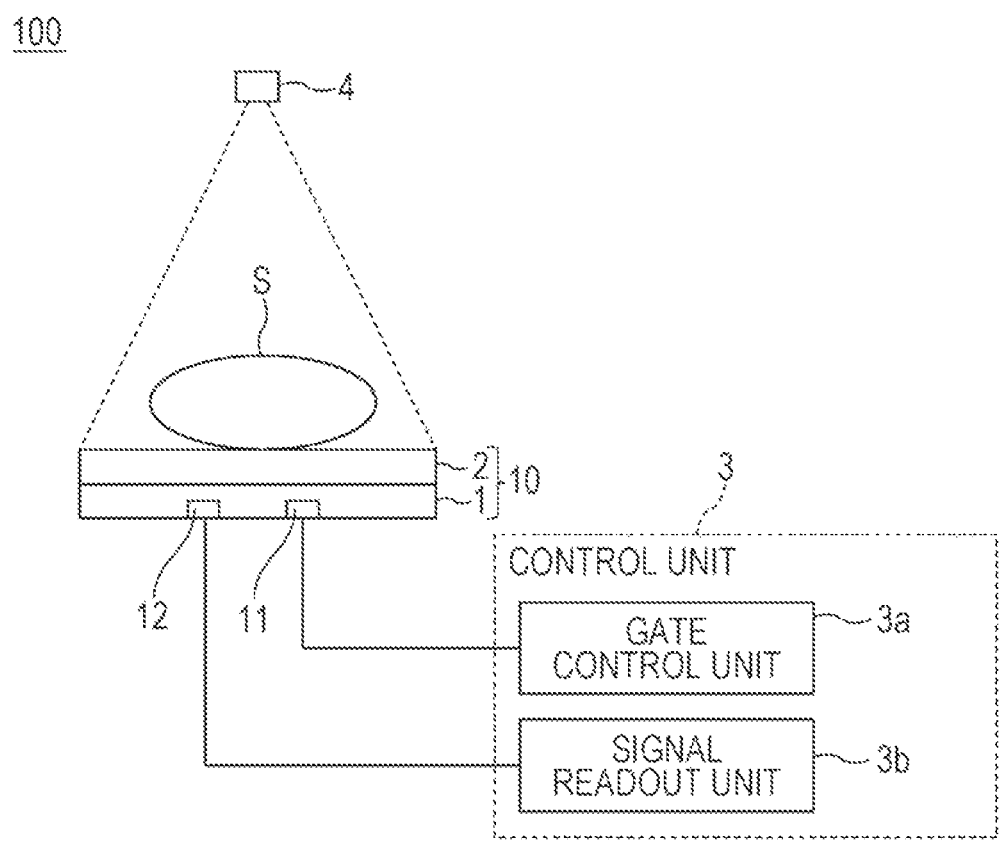
FIG. 1 is a diagram schematically showing a configuration of an X-ray imaging device according to a first embodiment.

FIG. 1 is a schematic view showing an X-ray imaging device 100 including an X-ray imaging panel 10 including a photoelectric conversion panel 1 according to a first embodiment. The X-ray imaging device 100 includes the X-ray imaging panel 10, which includes the photoelectric conversion panel 1 and a scintillator 2, a control unit 3, and an X-ray source 4. The control unit 3 includes a gate control unit 3a and a signal readout unit 3b. The gate control unit 3a is connected to a gate terminal 11 of the photoelectric conversion panel 1. Further, the signal readout unit 3b is connected to a data terminal 12.

The X-ray source 4 irradiates a subject S with X-rays. X-rays having passed through the subject S are converted into fluorescence (hereinafter referred to as "scintillation light") through the scintillator 2 disposed on top of the photoelectric conversion panel 1. The X-ray imaging device 100 acquires an X-ray image through the control unit 3 by imaging the scintillation light through the X-ray imaging panel 10.

Figure 2:
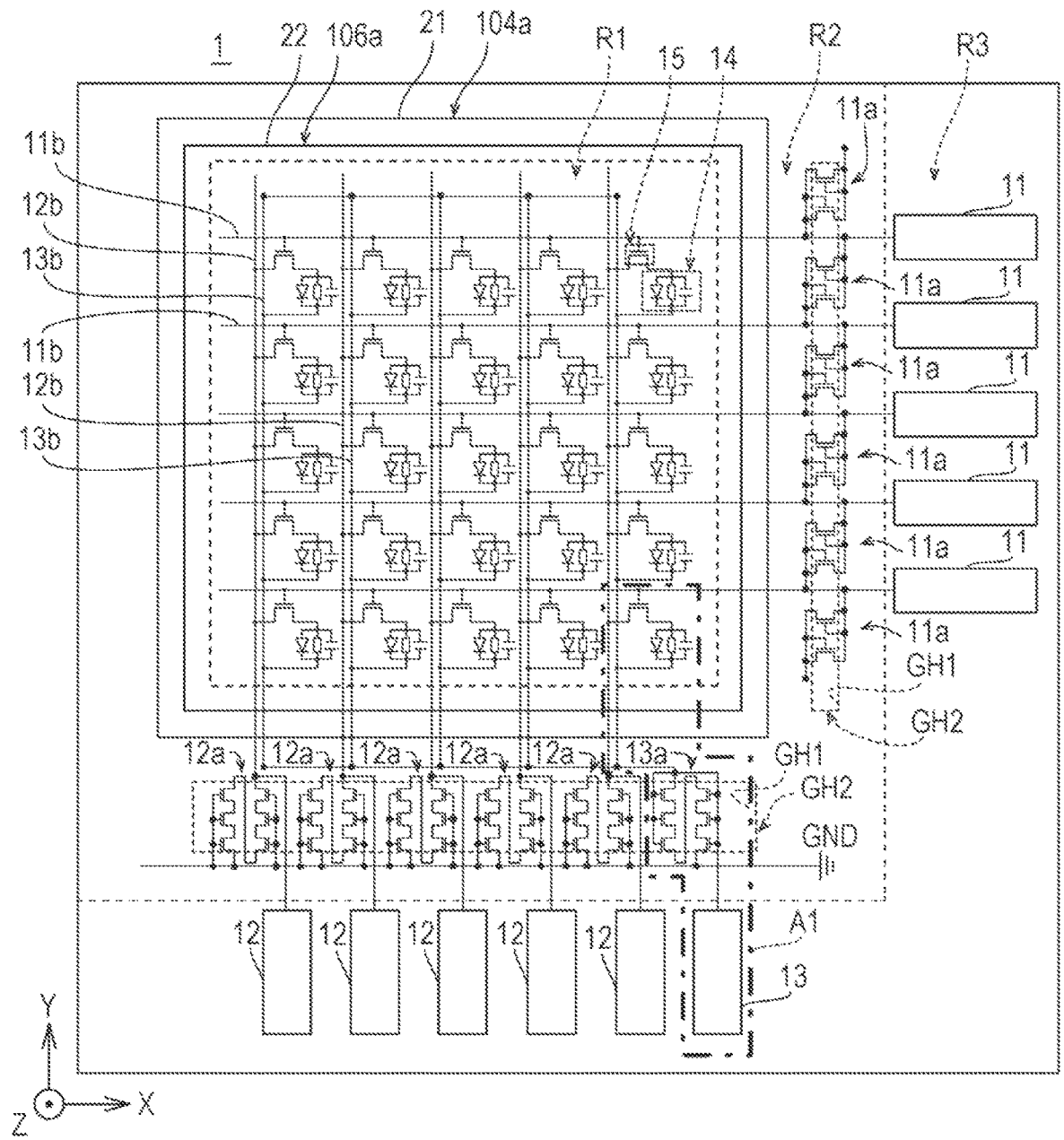
FIG. 2 is a schematic plan view showing a configuration of a photoelectric conversion panel.

FIG. 2 is a schematic view schematically showing a configuration of the photoelectric conversion panel 1. The photoelectric conversion panel 1 includes a plurality of the gate terminals 11, a plurality of the data terminals 12, a bias terminal 13, a photodiode 14, and a thin-film transistor (TFT) 15. Further, the photoelectric conversion panel 1 includes a first protection element 11a connected to the gate terminal 11 and a gate electrode 15a (see FIG. 3) of the TFT 15, a second protection element 12a connected to the data terminal 12 and a source electrode 15c (see FIG. 3) of the TFT 15, and a third protection element 13a connected to the bias terminal 13 and the photodiode 14. Further, the photoelectric conversion panel 1 includes a plurality of gate lines 11b separately connecting the plurality of gate terminals 11 and the TFT 15 via the first protection element 11a, a plurality of data lines 12b separately connecting the plurality of data terminals 12 and the TFT 15 via the second protection element 12a, and a plurality of bias lines 13b connecting the bias terminal 13 and the photodiode 14 via the third protection element 13a.

The first protection element 11a and the second protection element 12a have an ESD (electrostatic discharge) protection function with respect to the TFT 15. The third protection element 13a has an ESD (electrostatic discharge) protection function with respect to the photodiode 14.

Moreover, the photoelectric conversion panel 1 is provided with an active region R1, a protection element region R2, and a terminal region R3. In a plan view (when seen in a negative Z direction in FIG. 2), the active region R1 has a rectangular shape. The protection element region R2 is provided so as to surround the periphery of the active region R1 in a plan view. The terminal region R3 is provided in a position farther away from the protection element region R2 in a X direction and a position farther away from the protection element region R2 in a negative Y direction. In other words, part of the protection element region R2 is provided between the active region R1 and the terminal region R3.

Active Region R1

As shown in FIG. 2, in the active region R1, the plurality of gate lines 11b and the plurality of data lines 12b are formed so as to intersect each other. Further, the plurality of bias lines 13b is formed, for example, along the data lines 12b. Moreover, in the active region R1, the photodiode 14 and the TFT 15 are provided in each of areas (pixels) surrounded by the gate lines 11b and the data lines 12b. The photodiode 14 is constituted as a photoelectric conversion element through which scintillation light obtained by converting X-rays having passed through the subject S is converted into an electric charge corresponding to the amount of light.

Further, the control unit 3 applies a bias voltage to the photodiode 14 by applying a predetermined voltage (bias voltage) to the bias lines 13b. Moreover, the gate lines 11b in the photoelectric conversion panel 1 are switched in sequence to a selected state by the gate control unit 3a, and the TFT 15 connected to a gate line 11b that is in a selected state is brought into an on state. When the TFT 15 is brought into an on state, a signal corresponding to the electric charge obtained as a result of the conversion through the photodiode 14 is outputted to the signal readout unit 3b via the data line 12b.

Protection Element Region R2

As shown in FIG. 2, in the protection element region R2, a plurality of the first protection elements 11a, a plurality of the second protection elements 12a, and the third protection element 13a are provided. The plurality of first protection elements 11a are arranged side by side in a Y direction. The plurality of second protection elements 12a and the third protection element 13a are arranged side by side in an X direction.

Figure 3:
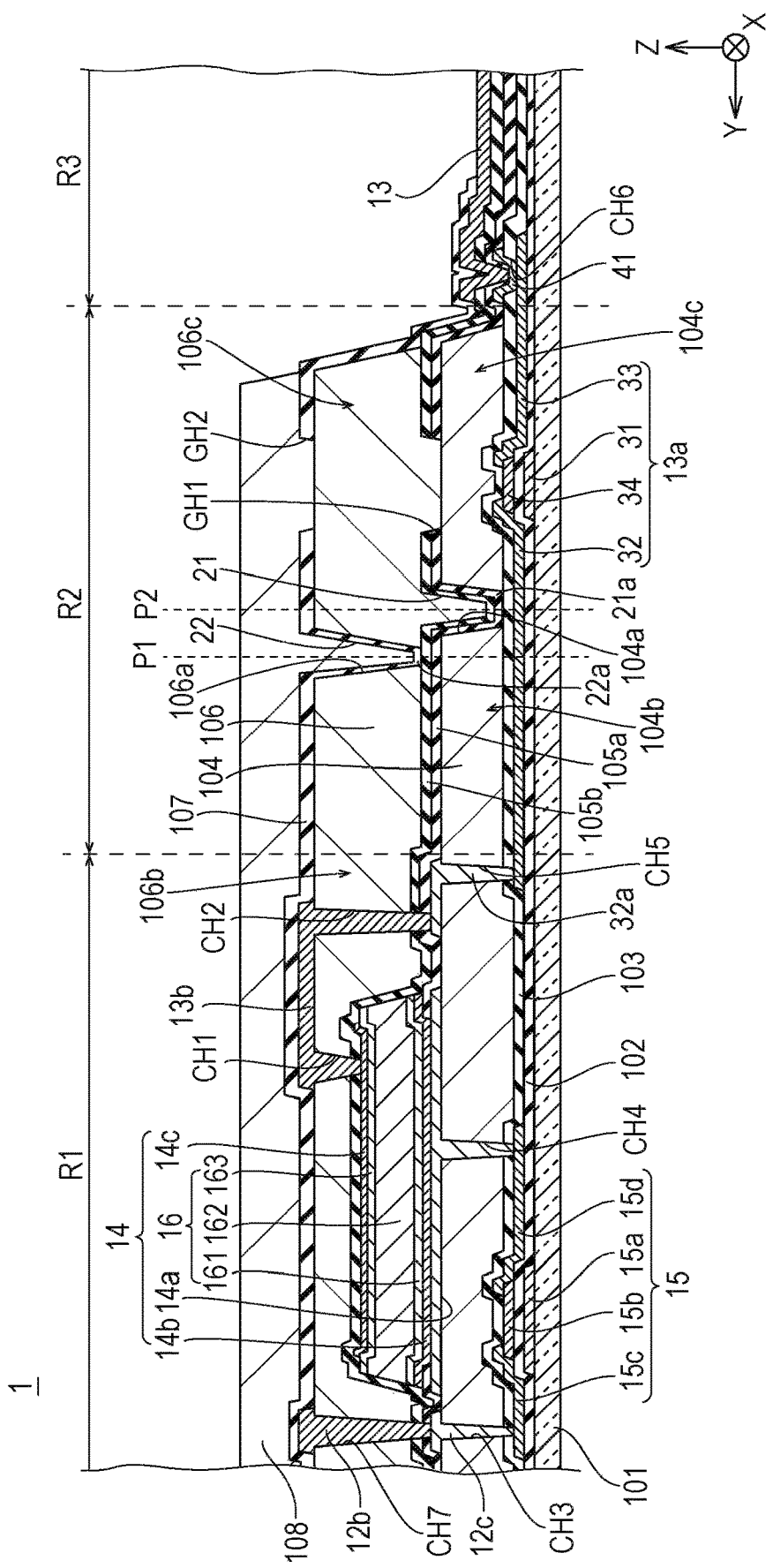
FIG. 3 is a cross-sectional view of an area A1 of FIG. 2 as taken along a Y direction.

In the first embodiment, the photoelectric conversion panel 1 includes first lower and upper inorganic films 105a and 105b having a first shielding portion 21 and a second inorganic film 107 having a second shielding portion 22. The first shielding portion 21 and the second shielding portion 22 are provided in the protection element region R2. As shown in FIG. 3, the first shielding portion 21 is a portion of the first lower and upper inorganic films 105a and 105b covering an inner surface of a first groove portion 104a of a first organic film 104. Further, the second shielding portion 22 is a portion of the second inorganic film 107 covering an inner surface of a second groove portion 106a of a second organic film 106.

Further, the first lower inorganic film 105a and the first upper inorganic film 105b has provided in the protection element region R2 a first opening GH1 through which gas and moisture pass. Further, the second inorganic film 107 has provided in the protection element region R2 a second opening GH2 through which gas and moisture pass. Moreover, the first shielding portion 21 and the second shielding portion 22 are constituted by a material that does not allow passage of gas or moisture. For example, the first shielding portion 21 and the second shielding portion 22 is constituted by silicon nitride ($SiN_x$). As a result, the first shielding portion 21 and the second shielding portion 22 has a function of inhibiting (blocking) gas and moisture having entered the protection element region R2 through the first opening GH1 and the second opening GH2 from entering the active region R1. That is, moisture and gas having entered the protection element region R2 through the first opening GH1 and the second opening GH2 are inhibited by the first shielding portion 21 in the first groove portion 104a and the second shielding portion 22 in the second groove portion 106a from entering the active region R1 through the first organic film 104 or the second organic film 106.

As shown in FIG. 2, the first groove portion 104a and the second groove portion 106a are both provided between each of the first and second openings GH1 and GH2 and the active region R1 in a plan view. Further, the first groove portion 104a and the first shielding portion 21 have frame shapes in a plan view. The second groove portion 106a and the second shielding portion 22 have frame shapes within the first shielding portion 21, which has a frame shape, in a plan view. For example, the first groove portion 104a and the second groove portion 106a both have rectangular frame shapes. Further, the first groove portion 104a (first shielding portion 21) and the second groove portion 106a (second shielding portion 22) are provided in such positions as not to overlap each other in a plan view. This configuration makes it possible to inhibit gas and moisture from entering a region (active region R1) surrounded by the first groove portion 104a (first shielding portion 21) and the second groove portion 106a (second shielding portion 22). Moreover, the depth of each of the first and second groove portions 104a and 106a can be made smaller than in a case where a single groove portion is provided across both the first organic film 104 and the second organic film 106. As a result, when the photoelectric conversion panel 1 is manufactured, the metal that needs to be removed can be inhibited from remaining in the first groove portion 104a, as the depth of the first groove portion 104a is small. Moreover, the metal that needs to be removed can be inhibited from remaining in the second groove portion 106a, as the depth of the second groove portion 106a is small. As a result of these, a photoelectric conversion panel 1 can be provided that is capable of inhibiting metal from remaining in the first groove portion 104a and the second groove portion 106a, which serve to inhibit moisture and gas from entering the active region R1. Further, even in a case where both the first shielding portion 21 and the second shielding portion 22 are configured to have frame shapes, the first shielding portion 21 and the second shielding portion 22 can be provided in different positions from each other in a plan view.

Further, part of the first shielding portion 21 (first groove portion 104a) and part of the second shielding portion 22 (second groove portion 106a) are disposed between the plurality of first protection elements 11a and the photodiode 14 and between the plurality of first protection elements 11a and the TFT 15 in a plan view. Further, part of the first shielding portion 21 (first groove portion 104a) and part of the second shielding portion 22 (second groove portion 106a) are disposed between the plurality of second protection elements 12a and the photodiode 14, between the plurality of second protection elements 12a and the TFT 15, between the third protection element 13a and the photodiode 14, and between the third protection element 13a and the TFT 15 in a plan view.

Further, the first opening GH1 of the first lower and upper inorganic films 105a and 105b and the second opening GH2 of the second inorganic film 107 are provided in such positions as to overlap the plurality of first protection elements 11a in a plan view. Further, the first opening GH1 and the second opening GH2 are also provided in such positions as to overlap the plurality of second protection elements 12a and the third protection element 13a in a plan view.

Terminal Region R3

As shown in FIG. 2, in the terminal region R3, the plurality of gate terminals 11, the plurality of data terminals 12, and the bias terminal 13 are provided. The plurality of gate terminals 11 are arranged side by side in the Y direction. The plurality of data terminals 12 and the bias terminal 13 are arranged side by side in the X direction.

Configuration of Photodiode

FIG. 3 shows a cross-section of an area A1 of FIG. 2 as taken along the Y direction. The photodiode 14 includes a first lower electrode 14a, a second lower electrode 14b, an upper electrode 14c, and a photoelectric conversion layer 16. The photoelectric conversion layer 16 is provided between the second lower electrode 14b and the upper electrode 14c. For example, the scintillation light obtained as a result of the conversion through the scintillator 2 enters the photoelectric conversion layer 16 through a side of the photoelectric conversion panel 1 facing in a positive Z direction. FIG. 3 shows an example of the area A1 of FIG. 2, which includes the third protection element 13a and the bias terminal 13. An area including the first protection elements 11a and the gate terminals 11 and an area including the second protection elements 12a and the data terminal 12 are not illustrated or described, as these areas are similar to those of FIG. 3. The example of the area A1 is described.

Configuration of TFT and Third Protection Element

As shown in FIG. 3, the TFT 15 has a gate electrode 15a integrated with a gate line 11b, a semiconductor active layer 15b, a source electrode 15c that is connected to a data line 12b, and a drain electrode 15d. The drain electrode 15d and the second lower electrode 14b are connected to each other via the first lower electrode 14a, which is provided in a contact hole CH4. A bias line 13b is formed in contact holes CH1 and CH2. The bias line 13b is connected to the photodiode 14 and a second connecting electrode 32a. The source electrode 15c is connected to the data line 12b via a source connecting electrode 12c formed in a contact hole CH3.

The third protection element 13a includes a first electrode 31, a second electrode 32, a third electrode 33, and a semiconductor layer 34. The third protection element 13a is configured such that gate electrodes and source electrodes (or drain electrodes) of a plurality of TFTs that are similar in structure to the TFT 15 are short-circuited with each other. This causes the third protection element 13a to function as a diode element for use in electrostatic protection. The first protection elements 11a and the second protection elements 12a are similar in configuration to the third protection element 13a.

Specifically, as shown in FIG. 3, the gate electrode 15a and the first electrode 31 are formed, for example, at the same layer over a glass substrate 101. The glass substrate 101 is an insulating substrate. The gate electrode 15a and the first electrode 31 are constituted as a laminated film containing tungsten (W) and tantalum nitride (TaN) as materials.

Further, the photoelectric conversion panel 1 includes a gate insulating film 102. The gate insulating film 102 is formed so as to cover the gate electrode 15a and the first electrode 31. The gate insulating film 102 is constituted by staking an upper layer and a lower layer, namely an insulating film composed of silicon nitride ($SiO_2$) and an insulating film composed of silicon nitride ($SiN_x$), on top of each other. The semiconductor active layer 15b and the source and drain electrodes 15c and 15d, which are connected to the semiconductor active layer 15b, are formed over the gate electrode 15a via the gate insulating layer 102 in the active region R1. Further, the semiconductor layer 34 and the second and third electrodes 32 and 33, which are connected to the semiconductor layer 34, are formed over the first electrode 31 via the gate insulating film 102 in the protection element region R2.

The semiconductor active layer 15b and the semiconductor layer 34 are formed in contact with the gate insulating layer 102. The semiconductor active layer 15b and the semiconductor layer 34 are composed of an oxide semiconductor. A usable example of the oxide semiconductor is $InGaO_3(ZnO)5$, zinc magnesium oxide ($Mg_xZn_{1-x}O$), zinc cadmium oxide ($Cd_xZn_{1-x}O$), cadmium oxide (CdO), InSnZnO (containing In (indium), Sn (tin), and Zn (zinc), an oxide semiconductor based on In (indium)-Al (aluminum)-Zn (zinc)-O (oxygen), or an amorphous oxide semiconductor containing indium (In), gallium (Ga), and zinc (Zn) with a predetermined ratio. Further, an "amorphous", "crystalline (including polycrystalline, microcrystalline, and c-axis orientation)" material may be applied as the oxide semiconductor. In the case of a laminated structure, any combination is included (or a particular combination is not excluded). In the first embodiment, the semiconductor active layer 15b and the semiconductor layer 34 are composed of an amorphous oxide semiconductor containing indium (In), gallium (Ga), and zinc (Zn) with a predetermined ratio, and are for example oxide semiconductor films with thicknesses of 100 µm. The application to the semiconductor active layer 15b of an oxide semiconductor containing indium (In), gallium (Ga), zinc (Zn), and oxygen (O) makes it possible to better reduce an off-leak current of the TFT 15 than amorphous silicon (a-Si). When the off-leak current of the TFT 15 is small, a high-sensitivity sensor panel is obtained, and a low-exposure sensor panel can be obtained by application to an X-ray imaging panel.

The source electrode 15c and the drain electrode 15d are disposed so as to make contact with part of the semiconductor active layer 15b over the gate insulating film 102. The second electrode 32 and the third electrode 33 are disposed so to make contact with part of the semiconductor layer 34 over the gate insulating film 102. The drain electrode 15d is connected to the first lower electrode 14a provided in the contact hole CH4. The source electrode 15c is connected to the source connecting electrode 12c provided in the contact hole CH3. The second electrode 32 is connected to the bias line 13b via the second connecting electrode 32a, which is provided in a contact hole CH5. The third electrode 33 is connected to the bias terminal 13 via a bias connecting electrode 41 provided in a contact hole CH6.

Further, the source electrode 15c, the drain electrode 15d, the second electrode 32, and the third electrode 33 are formed at the same layer. The source electrode 15c, the drain electrode 15d, the second electrode 32, and the third electrode 33 have, for example, a three-layer laminated structure in which a metal film composed of aluminum (Al) is sandwiched between two metal films composed of titanium (Ti).

Configuration of First Insulating Portion

As shown in FIG. 3, a first insulating film 103 (passivation film) is provided over the gate insulating film 102 so as to cover the source electrode 15c, the drain electrode 15d, the second electrode 32, and the third electrode 33. Further, the first insulating film 103 has openings (contact portions) over the source electrode 15c, the drain electrode 15d, the second electrode 32, and the third electrode 33. The first insulating film 103 is constituted, for example, by silicon oxide ($SiO_2$).

Configuration of First Organic Film

The first organic film 104 is provided over the first insulating film 103. That is, the first organic film 104 is formed at a higher layer than the TFT 15 and the third protection element 13a. As a result, the first organic film 104 has a function as a planarizing film for the TFT 15 and the third protection element 13a.

Further, by being provided with the first groove portion 104a, the first organic film 104 is configured such that a portion 104b of the first organic layer 104 extending from the first groove portion 104a toward the TFT 15 (in a positive Y direction) and a portion 104c of the first organic film 104 extending from the first groove portion 104a toward the third protection element 13a (in the negative Y direction) are disposed at a distance from each other.

Further, the first organic film 104 has openings (contact portions) over the source electrode 15c, the drain electrode 15d, and the second electrode 32. Moreover, by the openings of the first insulating layer 103 and the openings of the first organic film 104, the contact holes CH3 to CH5 are formed.

The first organic film 104 is composed, for example, of an acrylic material. The first organic film 104 has a film thickness of, for example, 2500 nm.

Configuration of First Lower Electrode, Source Connecting Electrode, Bias Connecting Electrode, and Terminal Connecting Electrode The first lower electrode 14a, the source connecting electrode 12c, and the second connecting electrode 32a are formed over the first organic film 104. Further, the photoelectric conversion panel 1 includes the bias connecting electrode 41. The bias connecting electrode 41 is formed in an opening (contact hole CH6) of the first insulating film 103 and connected to the third electrode 33 in the terminal region R3. The first lower electrode 14a passes through the contact hole CH4, and connects the drain electrode 15d and the second lower electrode 14b. The source connecting electrode 12c passes through the contact hole CH3, and connects the source electrode 15c and the data line 12b.

The first lower electrode 14a, the source connecting electrode 12c, and the bias connecting electrode 41 have, for example, a three-layer laminated structure in which a metal film composed of aluminum (Al) is sandwiched between two metal films composed of titanium (Ti). The two metal films composed of titanium (Ti) have different film thicknesses (e.g. 100 nm and 50 nm) from each other. The metal film composed of aluminum (Al) has a film thickness of, for example, 300 nm. Since the first lower electrode 14a and the source connecting electrode 12c contain aluminum, the first lower electrode 14a and the source connecting electrode 12c have comparatively low values of resistance, as aluminum has a comparatively small value of resistance.

Configuration of First Lower Inorganic Film

The first lower inorganic film 105a is formed so as to cover the first lower electrode 14a, the source connecting electrode 12c, the bias connecting electrode 41, and the first organic film 104. The first lower inorganic film 105a is provided with the first opening GH1. The first opening GH1 is provided above the third protection element 13a, for example, in the protection element region R2. Further, the first opening GH1 has a function of connecting the first organic film 104 and the second organic film 106. This configuration makes it possible to, even in a case where gas and moisture are produced during the manufacture of the photoelectric conversion panel 1, release the gas toward the second organic film 106 via the first opening GH1.

In the first embodiment, the first lower inorganic film 105a constitutes the first shielding portion 21 together with the first upper inorganic film 105b. In other words, the first shielding portion 21 is formed by coating the inner surface of the first groove portion 104a with the first lower inorganic film 105a and the first upper inorganic film 105b. Further, the first lower inorganic film 105a has an opening (contact portion), provided over the first lower electrode 14a, in which part of the second lower electrode 14b is provided. Further, the first lower inorganic film 105a has an opening (contact portion), provided over the source connecting electrode 12c, in which part of the data line 12b is provided. Further, the first lower inorganic film 105a has an opening (contact portion), provided over the bias connecting electrode 41, in which part of the bias terminal 13 is provided. In the first embodiment, the first lower inorganic film 105a and the first upper inorganic film 105b have a total film thickness of 600 nm.

Configuration of Second Lower Electrode

The second lower electrode 14b is formed so as to cover the openings of the first lower inorganic film 105a and part of the first lower inorganic film 105a. The second lower electrode 14b is formed by titanium (Ti). The second lower electrode 14b has a film thickness of, for example, 30 nm.

Configuration of Photoelectric Conversion Layer

The photodiode 14 includes the photoelectric conversion layer 16 and the upper electrode 14c. The photoelectric conversion layer 16 is formed over the second lower electrode 14b. The photoelectric conversion layer 16 is constituted by an n-type amorphous semiconductor layer 161, an intrinsic amorphous semiconductor layer 162, and a p-type amorphous semiconductor layer 163 being stacked in this order. The n-type amorphous semiconductor layer 161 is composed of amorphous silicon doped with an n-type impurity (e.g. phosphorus). The intrinsic amorphous semiconductor layer 162 is composed of intrinsic amorphous silicon. The intrinsic amorphous semiconductor layer 162 is formed in contact with the n-type amorphous semiconductor layer 161. The p-type amorphous semiconductor layer 163 is composed of amorphous silicon doped with a p-type impurity (e.g. boron). The p-type amorphous semiconductor layer 163 is formed in contact with the intrinsic amorphous semiconductor layer 162.

The upper electrode 14c is formed over the photoelectric conversion layer 16. The upper electrode 14c is constituted, for example, by ITO (indium tin oxide). The upper electrode 14c has a film thickness of, for example, 60 nm.

Configuration of First Upper Inorganic Film

The first upper inorganic film 105b is formed so as to cover the photodiode 14 and at least part of the first lower inorganic film 105a. Further, the first upper inorganic film 105b covers part of an upper surface of the photodiode 14 and a side surface of the photodiode 14. As a result, the first upper inorganic film 105b functions as a passivation film and a covering film for the photodiode 14, the first lower electrode 14a, and the source connecting electrode 12c. For example, the first upper inorganic film 105b is constituted by silicon nitride ($SiN_x$).

Further, the first upper inorganic film 105b has a first opening GH1 provided in the same position as that of the first lower inorganic film 105a. Further, the first upper inorganic film 105b is formed so as to coat the inner surface (inside surface) of the first groove portion 104a while being stacked on top of the first lower inorganic film 105a. Further, the first upper inorganic film 105b has openings (contacts) over the upper electrode 14c, the second electrode 32, the source connecting electrode 12c, and the bias connecting electrode 41.

Configuration of Second Organic Film

The second organic film 106 is formed at a higher than the first organic film 104 so as to cover at least part of the first upper inorganic film 105b and fill the first groove portion 104a and the first opening GH1. Further, the second organic film 106 has a function as a planarizing film that covers the photodiode 14 and that planarizes a step portion formed by the photodiode 14. Further, the second organic film 106 is in contact with the first organic film 104, for example, in the first opening GH1. The second organic film 106 is composed of a material which is similar to that of which the first organic film 104 is composed. The second organic film 106 has a film thickness of, for example, 2500 nm.

By being provided with the second groove portion 106a, the second organic film 106 is configured such that a portion 106b of the second organic film 106 extending from the second groove portion 106a toward the photodiode 14 (in the positive Y direction) and a portion 106c of the second organic film 106 extending from the second groove portion 106a toward the third protection element 13a (in the negative Y direction) are disposed at a distance from each other.

Further, the second organic film 106 is provided with openings constituting the contact holes CH2 and CH7 together with openings of the first lower and upper inorganic films 105a and 105b and an opening constituting the contact hole CH1 together with an opening of the first upper inorganic film 105b.

Configuration of Bias Line, Data Line, and Bias Terminal

The bias line 13b and the data line 12b are formed over the second organic film 106 in the active region R1. The bias terminal 13 is provided over the first upper inorganic film 105b in the terminal region R3. The bias line 13b passes through the contact hole CH1 to make contact with the upper electrode 14c, and passes through the contact hole CH2 to make contact with the second connecting electrode 32a. Further, the data line 12b passes through the contact hole CH7 to make contact with the source connecting electrode 12c. Further, the bias terminal 13 makes contact with the bias connecting electrode 41 in the contact hole CH6. The data line 12b, the bias line 13b, and the bias terminal 13 are constituted, for example, by ITO. The bias terminal 13 is exposed.

Configuration of Second Inorganic Film

The second inorganic film 107 is formed so as to cover the data line 12b and the bias line 13b over the second organic film 106 in the active region R1 and the protection element region R2. Further, the second inorganic film 107 is formed so as to cover part of the bias terminal 13 in the terminal region R3. Further, in the protection element region R2, the second inorganic film 107 is provided with a second opening GH2 through which the second organic film 106 and a third organic film 108 are connected to each other. Further, the second inorganic film 107 functions as a passivation film. Moreover, the second opening GH2 has a function of letting out gas and moisture from the second organic film 106 in the step of forming the third organic film 108 in manufacturing the photoelectric conversion panel 1. This configuration makes it possible to, even in a case where the photoelectric conversion panel 1 is provided with the third organic film 108, release gas and moisture generated during the manufacture of the photoelectric conversion panel 1 toward the third organic film 108 via the second opening GH2.

Further, the second opening GH2 is provided in such a position as to overlap the first opening GH1 in a plan view. This configuration minimizes the distance between the first opening GH1 and the second opening GH2 and therefore makes it possible to let out gas and moisture via the shortest route.

Further, the second shielding portion 22 is formed by coating the inner surface of the second groove portion 106a with the second inorganic film 107. The second shielding portion 22 has a bottom 22a in contact with a portion of the first upper inorganic film 105b not provided with the first shielding portion 21. That is, the second shielding portion 22 and the first upper inorganic film 105b are connected to each other by the second shielding portion 22 being formed in the second groove portion 106a with the first upper inorganic film 105b partially exposed. According to this configuration, the contact between the bottom 22a of the second shielding portion 22 and the first upper inorganic film 105b causes the gap between the second shielding portion 22 and the first upper inorganic film 105b to become smaller (i.e. become substantially zero), and the division of the second organic film 106 into the portion 106b and the portion 106c makes it possible to inhibit gas and moisture from entering the active region R1 via the second organic film 106. Further, the second inorganic film 107 has a film thickness of, for example, 400 nm.

Configuration of Third Organic Film

The third organic film 108 is formed so as to cover the second inorganic film 107. The third organic film 108 is formed at a higher than the second organic film 106 so as to cover the second inorganic film 107 and partially fill the second opening GH2 and the second groove portion 106a. The third organic film 108 has a function as a protective film that protects, for example, the second inorganic film 107. Further, the third organic film 108 is in contact with the second organic film 106, for example, in the second opening GH2. The third organic film 108 is composed of a material which is similar to that of which the second organic film 106 is composed. The third organic film 108 has a film thickness of, for example, 3000 nm.

Second Embodiment

Figure 4:
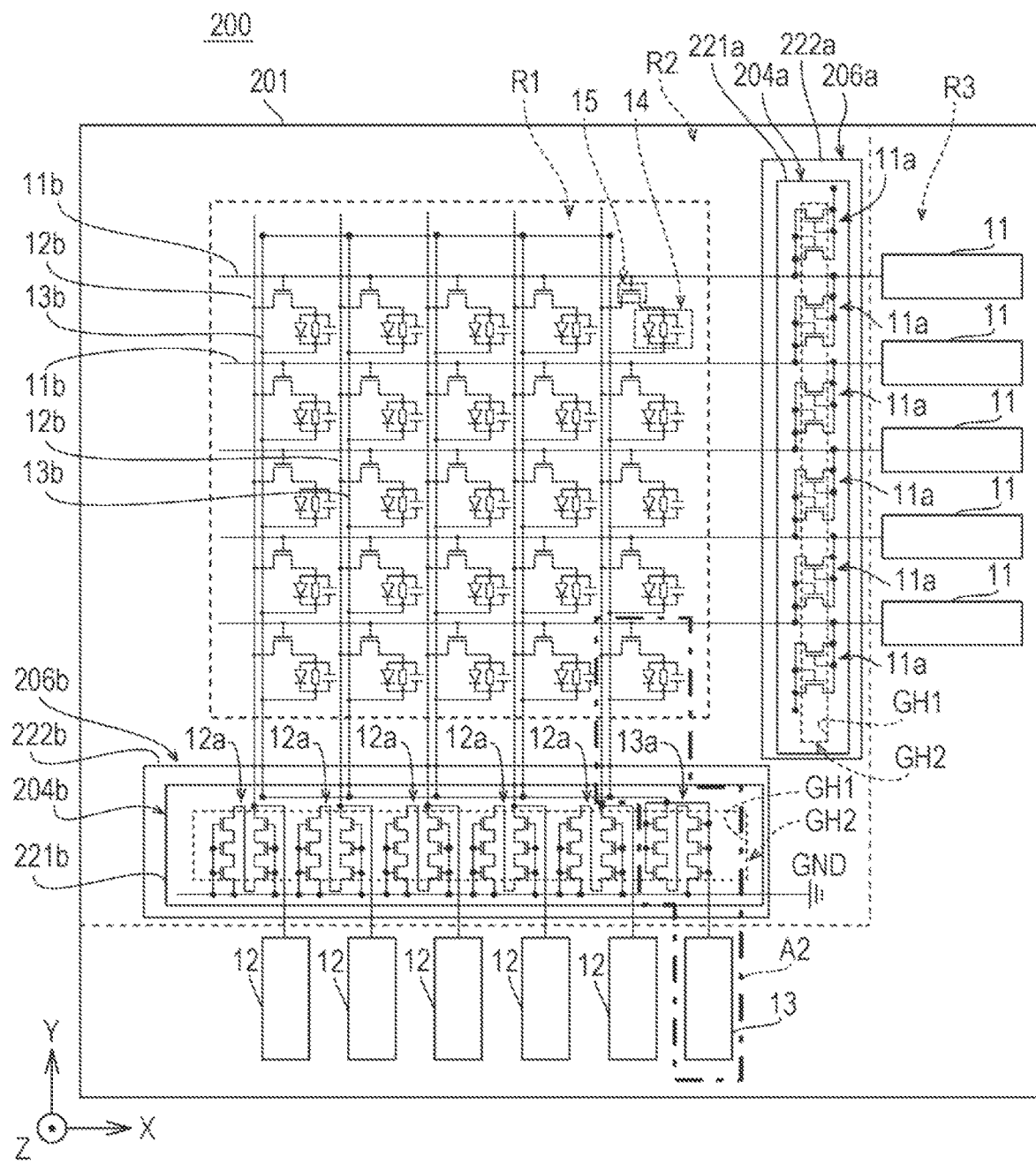
FIG. 4 is a schematic plan view showing a configuration of an X-ray imaging device (photoelectric conversion panel) according to a second embodiment.

FIG. 4 shows a configuration of an X-ray imaging device 200 according to a second embodiment. In the second embodiment, first groove portions 204a and 204b and second groove portions 206a and 206b are formed so as to surround first openings GH1 and second openings GH2, unlike in the first embodiment, in which the first groove portion 104a and the second groove portion 106a are formed so as to surround the active region R1. Components which are similar to those of the first embodiment are given the same signs as those of the first embodiment, and a description of such components is omitted.

Figure 5:
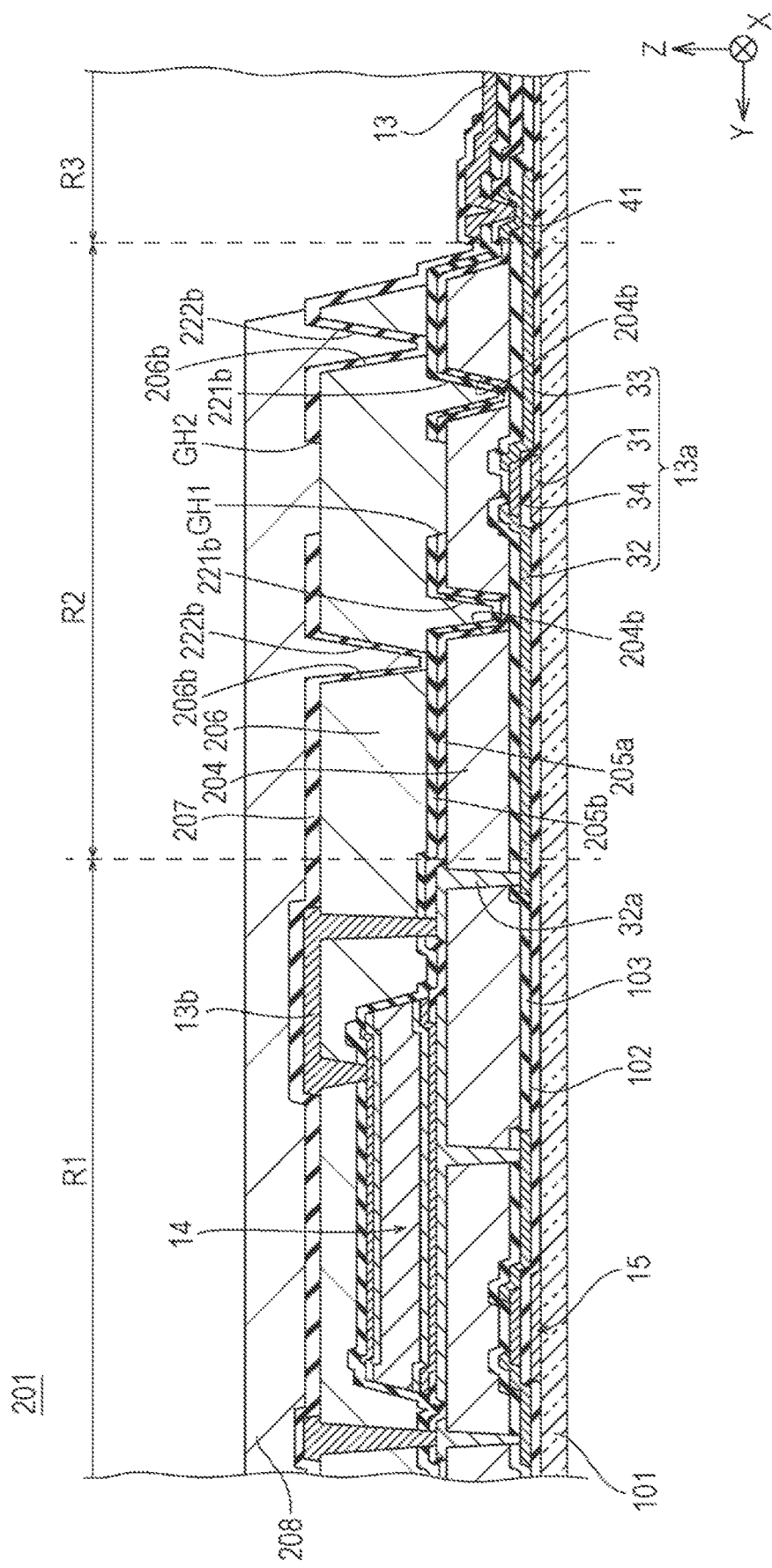
FIG. 5 is a cross-sectional view of an area A2 of FIG. 4 as taken along a Y direction.

The X-ray imaging device 200 has a photoelectric conversion panel 201. As shown in FIG. 5, the photoelectric conversion panel 201 includes a first organic film 204, first lower and upper inorganic films 205a and 205b, a second organic film 206, a second inorganic film 207, and a third organic film 208. The first organic film 204 has a first groove portion 204b formed on both sides of a Y-direction position in which a first opening GH1 and a second opening GH2 (third protection element 13a) are provided. The second organic film 206 has a second groove portion 206b formed on both sides of the Y-direction position in which the first opening GH1 and the second opening GH2 (third protection element 13a) are provided. A first shielding portion 221b is formed as a portion of the first lower and upper inorganic films 205a and 205b covering an inner surface of the first groove portion 204b. A second shielding portion 222b is formed as a portion of the second inorganic film 207 covering an inner surface of the second groove portion 206b. FIG. 5 shows a cross-sectional view of an area A2 including the third protection element 13a. An area including the first protection elements 11a and an area including the second protection elements 12a are not described, as these areas are similar in configuration to the area A2.

As shown in FIG. 4, the photoelectric conversion panel 201 includes first shielding portions 221a and 221b and second shielding portions 222a and 222b. Moreover, the first groove portion 204a (first shielding portion 221a) has, in a plan view, a frame shape surrounding first and second openings GH1 and GH2 provided above the first protection elements 11a. The first groove portion 204b (first shielding portion 221b) has, in a plan view, a frame shape surrounding first and second openings GH1 and GH2 provided above the second protection elements 12a and the third protection element 13a. Further, the second groove portion 206a (second shielding portion 222a) has, in a plan view, a frame shape surrounding both the first opening GH1 and the second opening GH2 outside the first groove portion 204a having a frame shape. Further, the second groove portion 206b (second shielding portion 222b) has, in a plan view, a frame shape surrounding both the first opening GH1 and the second opening GH2 outside the first groove portion 204b having a frame shape. According to this configuration, the first and second openings GH1 and GH2, through which gas and moisture enter, can be surrounded by the first shielding portion 221a and the second shielding portion 222a or the first shielding portion 221b and the second shielding portion 222b. This makes it possible to confine gas and moisture to a place surrounded by the first shielding portion 221a and the second shielding portion 222a or the first shielding portion 221b and the second shielding portion 222b. This can result in inhibition of entry of gas and moisture into the active region R1 from the region surrounded by the first shielding portion 221a and the second shielding portion 222a or the first shielding portion 221b and the second shielding portion 222b. The other components of the second embodiment is similar to those of the first embodiment.

Although the foregoing has described embodiments, the aforementioned embodiments are merely examples for carrying out the present disclosure. Therefore, the present disclosure is not limited to the aforementioned embodiments, but appropriate variations of the aforementioned embodiments may be carried out without departing from the scope of the present disclosure.

(1) Although the first and second embodiments have each illustrated an example in which a photoelectric conversion panel is applied to an X-ray imaging panel for use in an X-ray imaging device, this example is not intended to impose any limitation. That is, the photoelectric conversion panel may be applied to a panel for use in a non-X-ray optical sensor.

(2) Although the first and second embodiments have each illustrated examples of film thicknesses of layers (films) constituting a photoelectric conversion panel, materials of such layers (films), and methods for manufacturing such layers (films), these examples are not intended to impose any limitation. That is, layers (films) constituting a photoelectric conversion panel may be constituted by film thicknesses and materials other than the foregoing examples. For example, a first organic film, a second organic film, and a third organic film may be constituted by organic materials differing from one another. Further, a first inorganic insulating film, a second inorganic insulating film, and a second inorganic film may be constituted by inorganic materials differing from one another. Further, a TFT may be constituted by a material other than IGZO.

Figure 6:
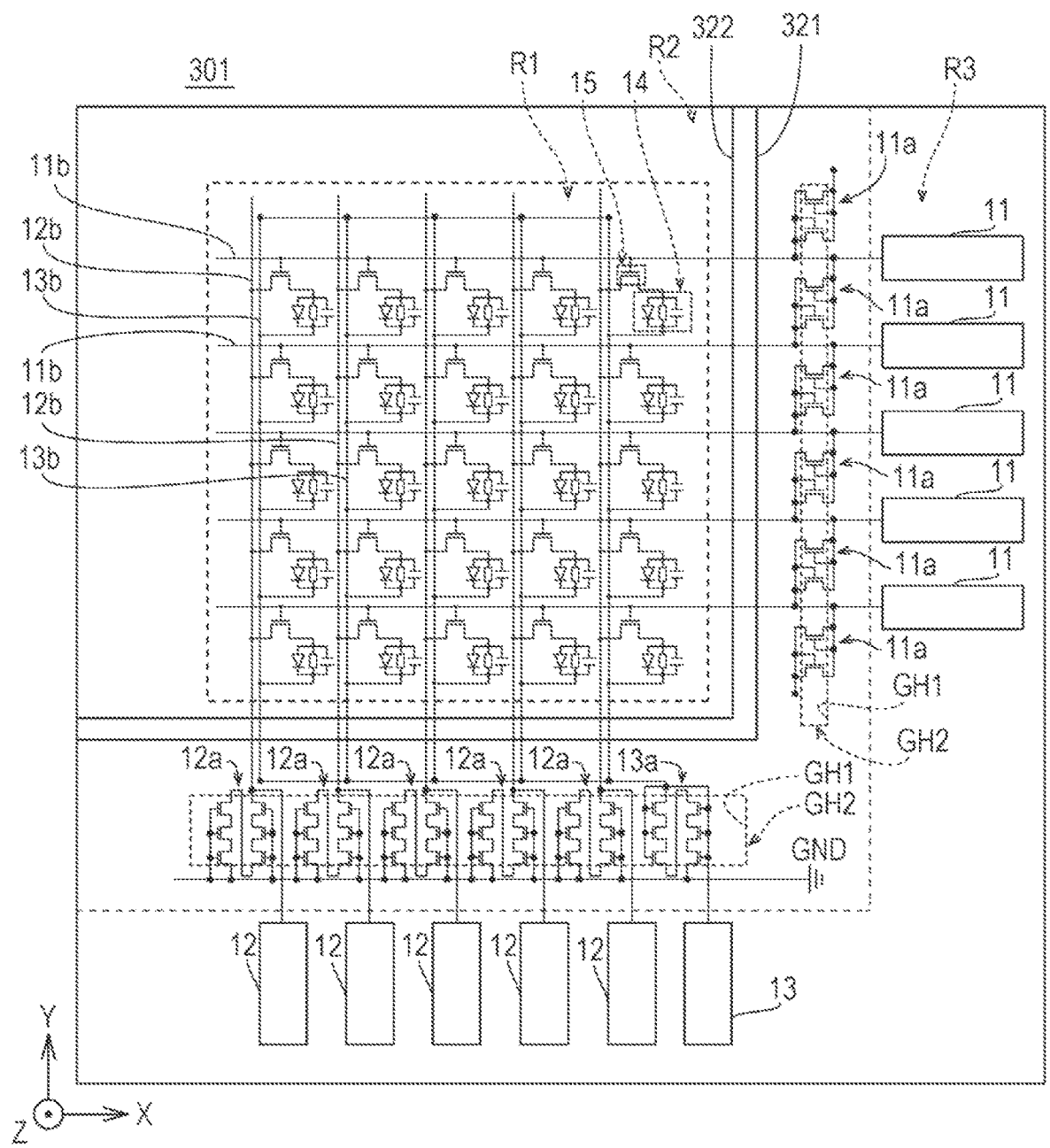
FIG. 6 is a cross-sectional view of a photoelectric conversion panel according to a first modification.
Figure 7:
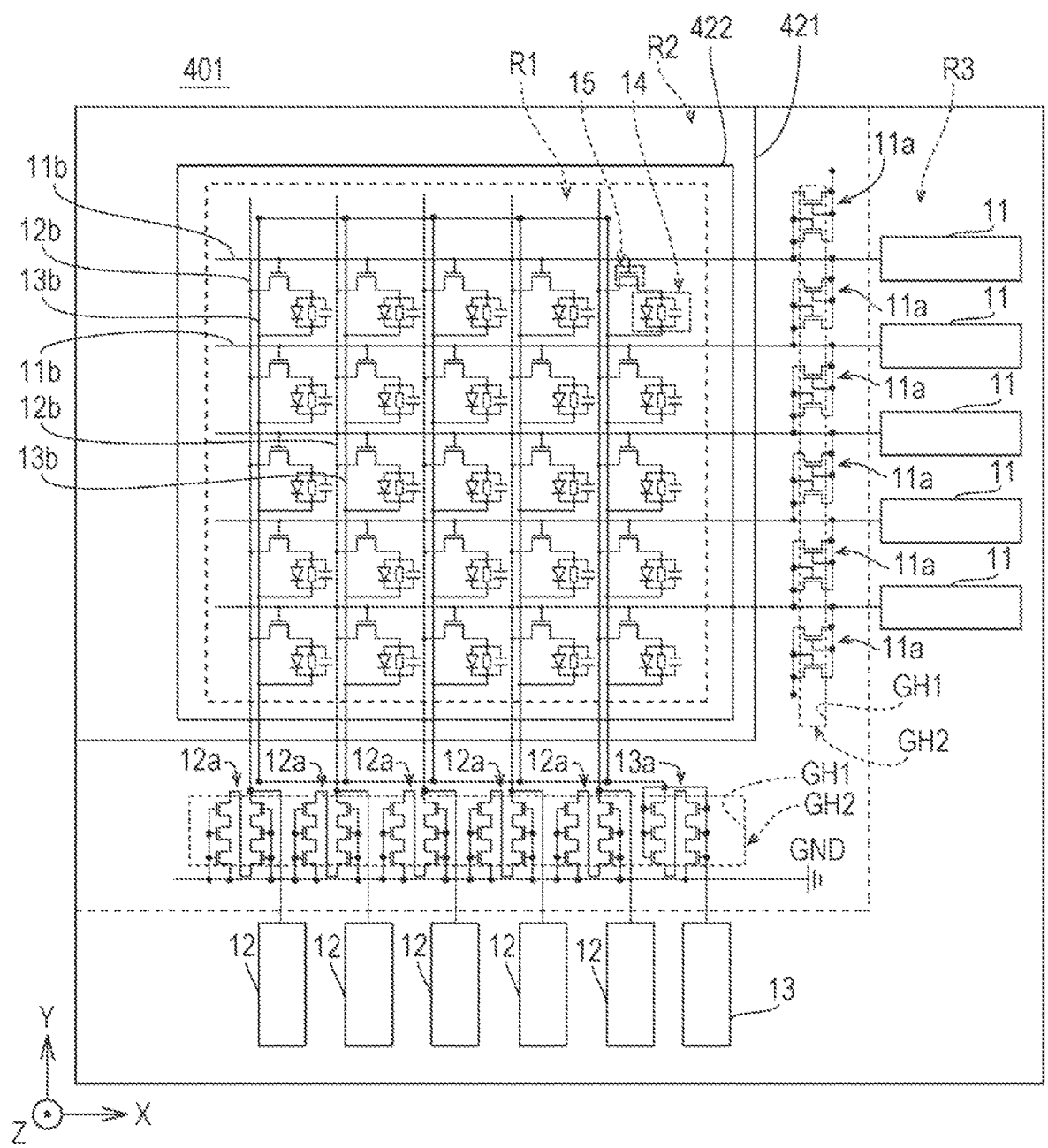
FIG. 7 is a cross-sectional view of a photoelectric conversion panel according to a second modification.

(3) Although the first and second embodiments have each illustrated an example in which a first shielding portion (first groove portion) and a second shielding portion (second groove portion) are configured to have frame shapes in a plan view, this example is not intended to impose any limitation. For example, as in the case of a photoelectric conversion panel 301 according to a first modification of FIG. 6, a first shielding portion 321 and a second shielding portion 322 may each be formed in the shape (e.g. an L shape) of a line having no frame shape in a plan view. Further, as in the case of a photoelectric conversion panel 401 according to a second modification of FIG. 7, either of a first shielding portion 421 and a second shielding portion 422 (in FIG. 7, the first shielding portion 421) may be formed in the shape (e.g. an L shape) of a line having no frame shape in a plan view, and the other (in FIG. 7, the second shielding portion 422) may be formed into a frame shape in a plan view. Further, a first shielding portion (first groove portion) and a second shielding portion (second groove portion) may each be formed in the shape of a straight line instead of an L shape or a frame shape in a plan view.

(4) Although the first and second embodiments have each illustrated an example in which a first opening and a second opening are provided in positions above each of first to third protection elements, this example is not intended to impose any limitation. That is, the first opening and the second opening may be provided in only some of the first to third protection elements. Alternatively, the first opening and the second opening may be provided in positions different from the positions above each of the first to third protection elements and places other than the active region. Alternatively, the first opening and the second opening may not be provided. In a case where the first opening and the second opening are not provided, the first shielding portion (first groove portion) and the second shielding portion (second groove portion) fulfill a function of blocking gas and moisture entering from the terminal region.

(5) Although the first embodiment has illustrated an example in which a frame-shaped second groove portion (second shielding portion) is provided within a frame-shaped first groove portion (first shielding portion) and the second embodiment has illustrated an example in which a frame-shaped second groove portion (second shielding portion) is provided outside a frame-shaped first groove portion (first shielding portion), these examples are not intended to impose any limitation. That is, the first embodiment may be configured such that a frame-shaped second groove portion (second shielding portion) is provided outside a frame-shaped first groove portion (first shielding portion), and the second embodiment may be configured such that a frame-shaped second groove portion (second shielding portion) is provided within a frame-shaped first groove portion (first shielding portion).

(6) Although the first and second embodiments have each illustrated an example in which a second shielding portion has a bottom in contact with a portion of a first upper inorganic film not provided with a first shielding portion, this example is not intended to impose any limitation. That is, the present disclosure does not necessarily need the bottom of the second shielding portion to make contact with the first upper inorganic film. For example, a gap may be provided between the bottom of the second shielding portion and the first upper inorganic film.

The aforementioned photoelectric conversion panel can also be described in the following manner.

A photoelectric conversion panel according to a first configuration includes a thin-film transistor provided in a first region, a photoelectric conversion element provided in the first region and formed at a higher layer than the thin-film transistor, a first organic film covering the thin-film transistor and having a first groove portion provided in a second region differing from the first region, a second organic film covering the photoelectric conversion element and having a second groove portion provided in the second region and in a position different from that of the first groove portion in a plan view, a first inorganic film formed so as to cover the first organic film and cover an inner surface of the first groove portion, and a second inorganic film formed so as to cover the second organic film and cover an inner surface of the second groove portion (first configuration).

According to the first configuration, the first groove portion and the second groove portion are provided in different positions from each other in a plan view. As a result, the depth of each of the first and second groove portions can be made smaller than in a case where a single groove portion is provided across both the first organic film and the second organic film. As a result, when the photoelectric conversion panel is manufactured, the metal that needs to be removed can be inhibited from remaining in the first groove portion, as the depth of the first groove portion is small. Moreover, the metal that needs to be removed can be inhibited from remaining in the second groove portion, as the depth of the second groove portion is small. As a result of these, a photoelectric conversion panel can be provided that is capable of inhibiting metal from remaining in a groove portion that serves to inhibit moisture and gas from entering a first region in which a thin-film transistor and a photoelectric conversion element are provided.

In the first configuration, the first groove portion may have a frame shape in a plan view, and the second groove portion may have, in a plan view, a frame shape within or outside the first groove portion having a frame shape (second configuration).

The second configuration makes it possible to inhibit gas and moisture from entering a region surrounded by the first groove portion (i.e. part of the first inorganic film) and the second groove portion (i.e. part of the second inorganic film) or to inhibit gas and moisture from entering the first region from the surrounded region. Moreover, even in a case where both the first groove portion and the second groove portion are configured to have frame shapes, the first groove portion and the second groove portion can be easily formed in different positions from each other in a plan view.

In the second configuration, the first groove portion may have a frame shape surrounding the first region in a plan view, and the second groove portion may have, in a plan view, a frame shape surrounding the first region within or outside the first groove portion having a frame shape (third configuration).

According to the third configuration, the first groove portion (i.e. part of the first inorganic film) and the second groove portion (i.e. part of the second inorganic film) make it possible to more certainly inhibit gas and moisture from entering the first region.

In the second configuration, which may further include a protection element electrically connected to at least either the thin-film transistor or the photoelectric conversion element and provided in the second region, the first inorganic film may have a first opening formed in a position above the protection element, the second inorganic film may have a second opening formed in a position above the protection element, the first groove portion may have a frame shape surrounding both the first opening and the second opening in a plan view, and the second groove portion may have, in a plan view, a frame shape surrounding both the first opening and the second opening within or outside the first groove portion having a frame shape (fourth configuration).

According to the fourth configuration, the first and second openings, through which gas and moisture enter, can be surrounded by the first groove portion (i.e. part of the first inorganic film) and the second groove portion (i.e. part of the second inorganic film). This makes it possible to confine gas and moisture to the region surrounded by the first groove portion (i.e. part of the first inorganic film) and the second groove portion (i.e. part of the second inorganic film). This can result in inhibition of entry of gas and moisture into the first region from the region surrounded by the first groove portion (i.e. part of the first inorganic film) and the second groove portion (i.e. part of the second inorganic film).

In any of the first to fourth configurations, which may further include a protection element electrically connected to at least either the thin-film transistor or the photoelectric conversion element and provided in the second region, the first inorganic film may have a first opening formed in a position above the protection element, the second inorganic film may have a second opening formed in a position above the protection element, and the first groove portion and the second groove portion may both be provided between each of the first and second openings and the first region in a plan view (fifth configuration).

According to the fifth configuration, the first groove portion (i.e. part of the first inorganic film) and the second groove portion (i.e. part of the second inorganic film) make it possible to inhibit gas and moisture having entered through the first opening and the second opening from entering the first region.

In any of the first to fifth configurations, the second inorganic film may make contact with the first inorganic film at a bottom of the second groove portion (sixth configuration).

According to the sixth configuration, the contact between the bottom of the second inorganic film and the first inorganic film causes the gap between the second inorganic film and the first inorganic film to become smaller (i.e. become substantially zero), and since the second organic film can be divided, entry of gas and moisture into the first region via the second organic film can be inhibited.

The present disclosure contains subject matter related to that disclosed in U.S. Provisional Patent Application No. 63/063,620 filed in the United States Patent Office on Aug. 10, 2020, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A photoelectric conversion panel comprising:
a thin-film transistor provided in a first region;
a photoelectric conversion element provided in the first region and formed at a higher layer than the thin-film transistor;
a first organic film covering the thin-film transistor and having a first groove portion provided in a second region differing from the first region;
a second organic film covering the photoelectric conversion element and having a second groove portion provided in the second region and in a position different from that of the first groove portion in a plan view;
a first inorganic film formed so as to cover the first organic film and cover an inner surface of the first groove portion;
a second inorganic film formed so as to cover the second organic film and cover an inner surface of the second groove portion; and
a protection element electrically connected to at least one of the thin-film transistor and the photoelectric conversion element and provided in the second region, wherein
the first inorganic film has a first opening formed in a position above the protection element,
the second inorganic film has a second opening formed in a position above the protection element,
the first groove portion has a frame shape surrounding both the first opening and the second opening in the plan view, and
the second groove portion has, in the plan view, a frame shape surrounding both the first opening and the second opening within or outside the first groove portion having the frame shape.

2. The photoelectric conversion panel according to claim 1, wherein
the frame shape of the first groove portion further surrounds the first region in the plan view, and
the frame shape of the second groove portion further surrounds the first region within or outside the first groove portion having the frame shape.

3. The photoelectric conversion panel according to claim 1, wherein the second inorganic film makes contact with the first inorganic film at a bottom of the second groove portion.

4. A photoelectric conversion panel comprising:
a thin-film transistor provided in a first region;
a photoelectric conversion element provided in the first region and formed at a higher layer than the thin-film transistor;
a first organic film covering the thin-film transistor and having a first groove portion provided in a second region differing from the first region;
a second organic film covering the photoelectric conversion element and having a second groove portion provided in the second region and in a position different from that of the first groove portion in a plan view;
a first inorganic film formed so as to cover the first organic film and cover an inner surface of the first groove portion;
a second inorganic film formed so as to cover the second organic film and cover an inner surface of the second groove portion; and
a protection element electrically connected to at least one of the thin-film transistor and the photoelectric conversion element and provided in the second region, wherein
the first inorganic film has a first through hole formed in a position above the protection element,
the second inorganic film has a second through hole formed in a position above the protection element, and
the first groove portion and the second groove portion are both provided between each of the first and second through holes and the first region in the plan view.

5. The photoelectric conversion panel according to claim 4, wherein the protection element is composed of a diode.

* * * * *